US006718608B2

United States Patent
Wah et al.

(10) Patent No.: US 6,718,608 B2
(45) Date of Patent: Apr. 13, 2004

(54) MULTI-PACKAGE CONVERSION KIT FOR A PICK AND PLACE HANDLER

(75) Inventors: Sum Kai Wah, Singapore (SG); Tan Wee Boon, Singapore (SG); Yap Liop Jin, Singapore (SG)

(73) Assignee: St Assembly Test Services Pte LTD, Singapore (SG)

( * ) Notice: Subject to any disclaimer, the term of this patent is extended or adjusted under 35 U.S.C. 154(b) by 0 days.

(21) Appl. No.: 10/054,423

(22) Filed: Jan. 22, 2002

(65) Prior Publication Data

US 2003/0140475 A1 Jul. 31, 2003

(51) Int. Cl.[7] .......................... B23P 23/00; B23P 19/00
(52) U.S. Cl. ..................................... 29/401.1; 29/743
(58) Field of Search ........................... 29/401.1, 743, 29/729, DIG. 44, 825, 832; 324/755, 765; 257/E21.525

(56) References Cited

U.S. PATENT DOCUMENTS

| 5,184,068 | A | 2/1993 | Twigg et al. ............... 324/158 |
| 5,920,192 | A | 7/1999 | Kiyokawa | |
| 5,924,183 | A | * 7/1999 | Kelly et al. ................ 29/401.1 |
| 5,966,940 | A | 10/1999 | Gower et al. ................. 62/3.3 |
| 6,339,321 | B1 | 1/2002 | Yamashita et al. | |
| 6,445,203 | B1 | 9/2002 | Yamashita et al. | |
| 6,636,060 | B1 | 10/2003 | Saito | |
| 2001/0054891 | A1 | 12/2001 | Sagawa | |
| 2002/0070144 | A1 | 6/2002 | Shim | |

* cited by examiner

*Primary Examiner*—John C. Hong

(57) ABSTRACT

A method is provided for package-to-package conversion of a pick and place handler. An input arm assembly is provided with interchangeable vacuum leads. An input/output shuttle plate is provided comprising a block and base plate. The block has a plurality of pocket groupings and a two or more alignment hole groupings. The base plate has two or more alignment pins. Package-to-package conversion is achieved by changing alignment hole groupings on the alignment pins, thereby selecting the pocket corresponding to the alignment hole used. A soak plate is provided having an array of pocket groupings, wherein each pocket grouping has the same pattern of different size/shape pockets to accommodate different packages. Package-to-package conversion is accomplished by programming an offset to the desired pocket in each pocket grouping. A test arm assembly is provided with interchangeable vacuum leads and interchangeable nest pieces.

1 Claim, 7 Drawing Sheets

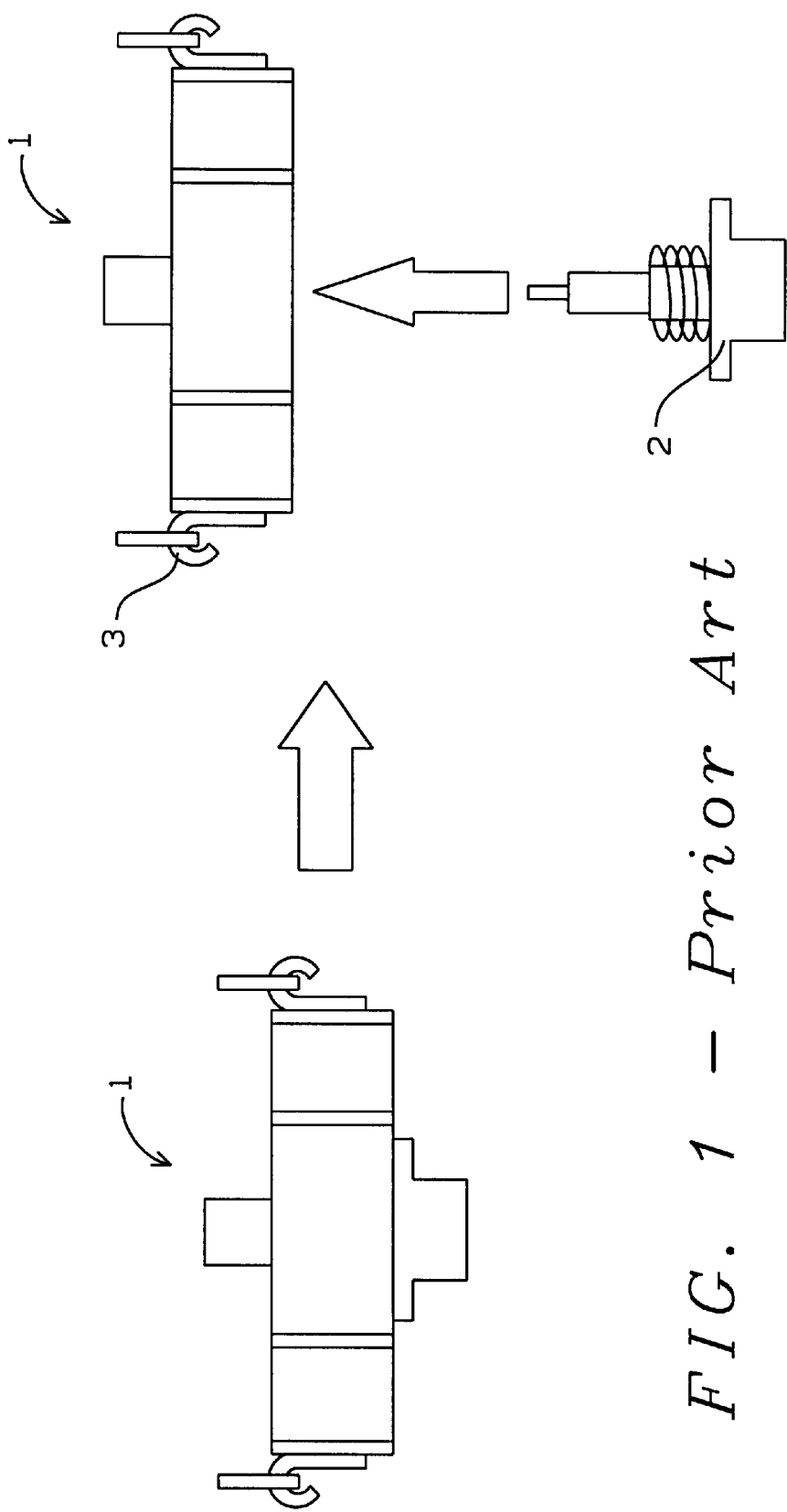
FIG. 1 – Prior Art

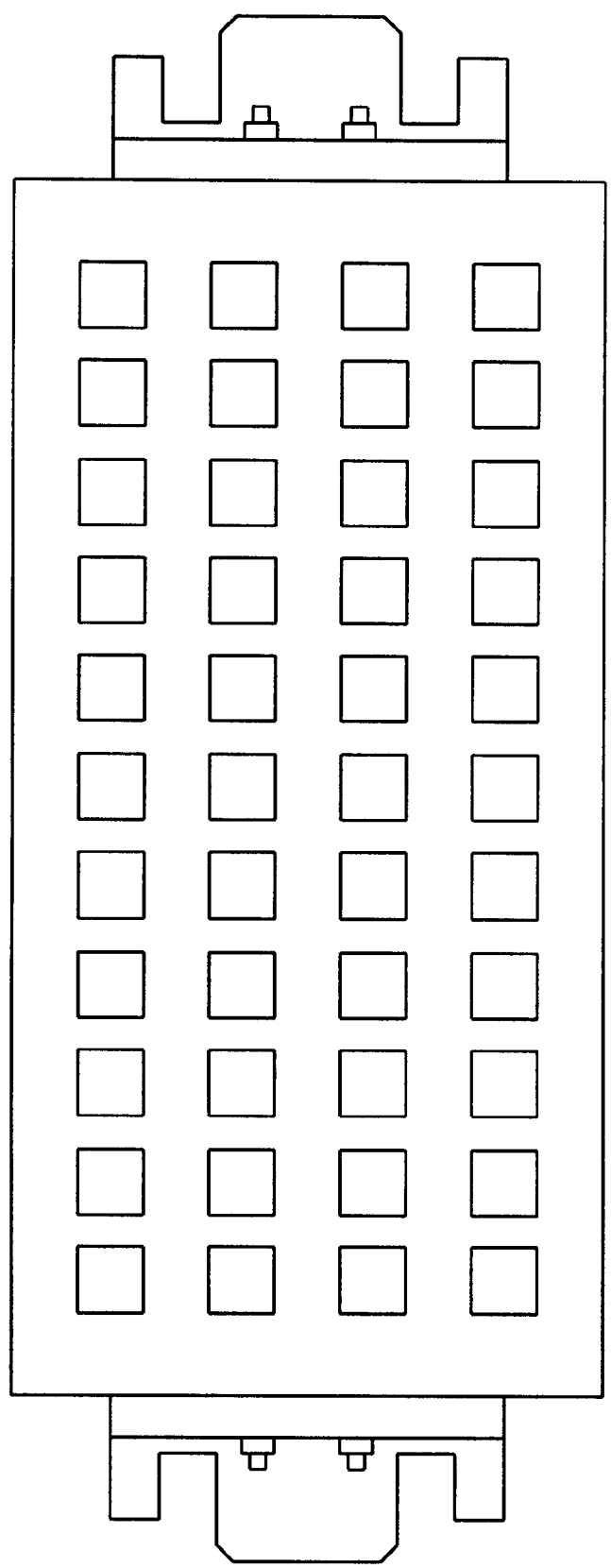
FIG. 2 – Prior Art

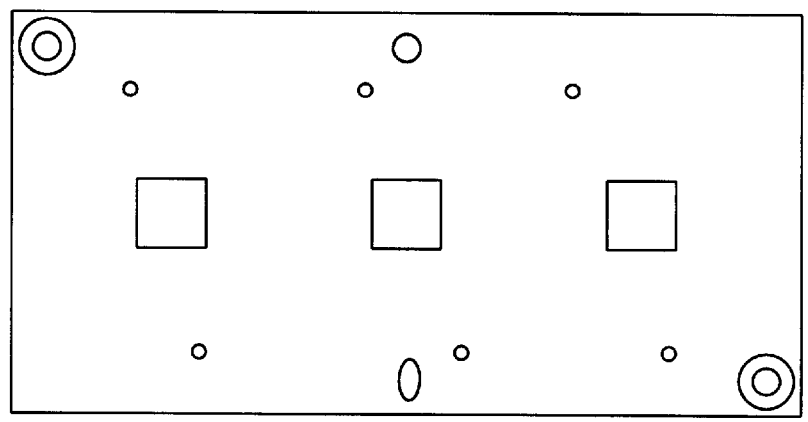
FIG. 3 – Prior Art
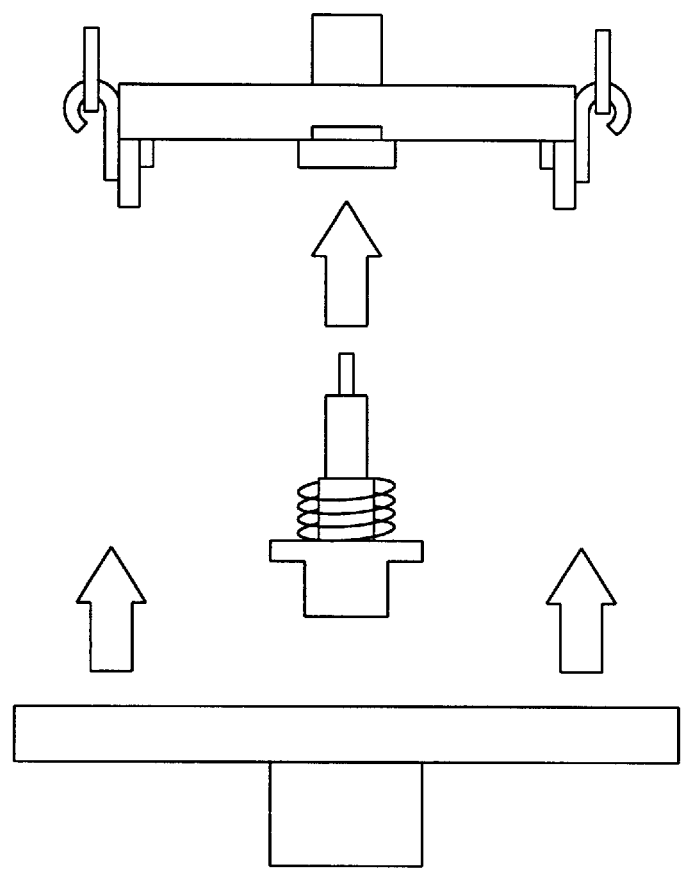
FIG. 4 – Prior Art

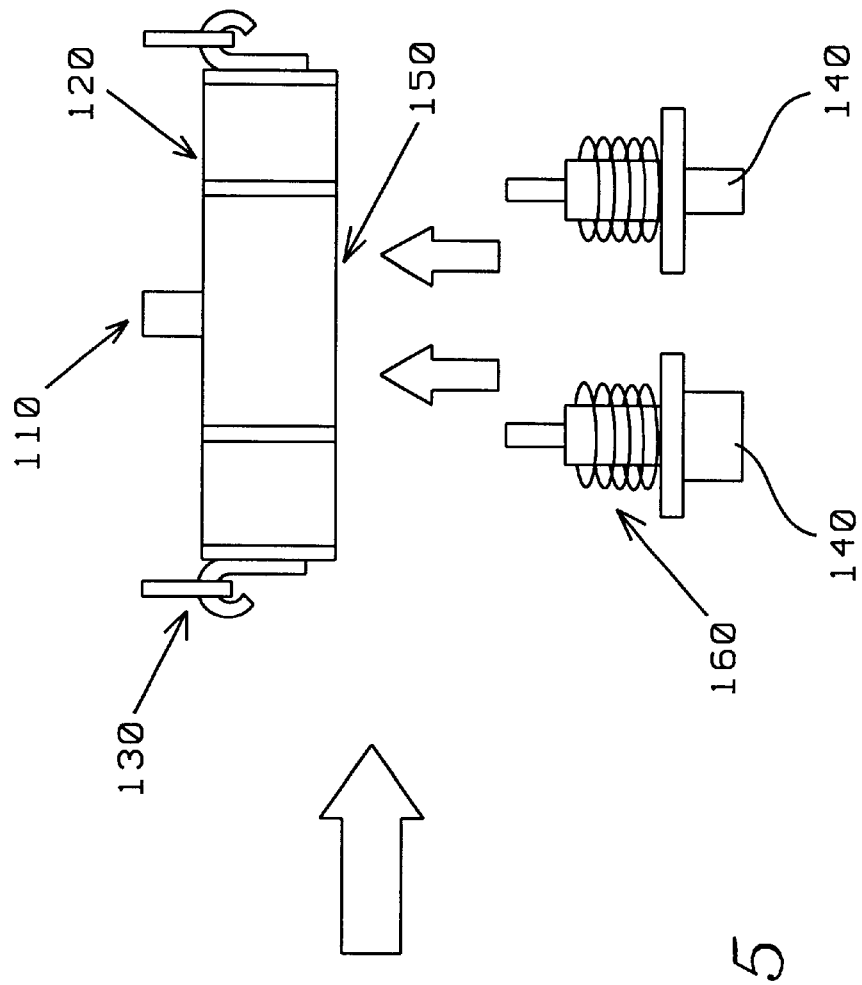
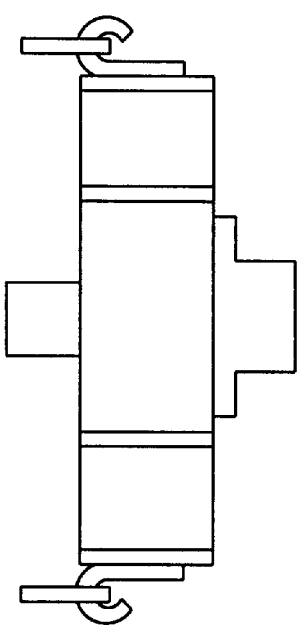
FIG. 5

MULTI-PACKAGE CONVERSION KIT FOR A PICK AND PLACE HANDLER

BACKGROUND OF INVENTION

1) Field of the Invention

This invention relates generally to surface mount assembly of semiconductor devices and more particularly to a method and device for converting a pick and place handler for use with devices having different packages and/or different sizes.

2) Description of the Prior Art

Pick and place handlers are widely used in surface mount technology for physically moving semiconductor devices during assembly and test. A vacuum lead is typically used to pick up a semiconductor device and hold it during transport to a new location (e.g. a circuit board or a holding fixture). However, different packages and even different sizes of a common package can require different vacuum leads.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,184,068 (Twigg et al.) describes a pick and place handler.

U.S. Pat. No. 5,966,940 (Gower et al.) shows a thermal conditioning unit that can be incorporated into a pick and place handler.

SUMMARY OF THE INVENTION

It is an object of the present invention to provide a method and device for converting a pick and place handler to accommodate various semiconductor packages and/or sizes.

It is another object of the present invention to provide an economical method and device for converting a pick and place handler to accommodate various semiconductor packages and/or sizes.

It is yet another object of the present invention to provide a method for converting a pick and place handler to accommodate various semiconductor packages and/or sizes with reduced conversion and set-up time.

To accomplish the above objectives, the present invention provides a method and conversion kit which can be used to convert a pick and place handler for a different semiconductor package economically, and with minimum conversion and set-up time. An input arm assembly is provided with interchangeable vacuum leads such that package-to-package conversion only requires replacing the vacuum lead with a different size vacuum lead. An input/output shuttle pate is provided comprising a block and base plate. The block has a plurality of pocket groupings and a two or more alignment hole groupings. The base plate has two or more alignment pins. Package-to-package conversion is achieved by changing which alignment hole in each alignment hole grouping is set on the alignment pins, thereby selecting the pocket in each pocket grouping corresponding to the alignment hole used. A soak plate is provided having an array of pocket groupings, wherein each pocket grouping has the same pattern of different size/shape pockets to accommodate different packages. Package-to-package conversion is accomplished by programming an offset to the desired pocket in each pocket grouping a test arm assembly is provided with interchangeable vacuum leads and interchangeable nest pieces such that package-to-package conversion only requires replacing the vacuum lead and nest piece with a different size vacuum lead and nest piece.

The present invention provides considerable improvement over the prior art. Setup time is reduced because the input arm assembly and test arm assembly can be converted by changing the interchangeable vacuum lead and the interchangeable nest piece as required, instead of changing the entire input arm assembly and the entire test arm. Set-up time is also reduced by the soak plate and input/output shuttle plate which can accommodate different packages, eliminating the need to replace them. Tool inventory and maintenance cost is reduced because separate input arm assemblies, test arm assemblies, soak plates, and input/output shuttle plates do not need to be provided and maintained for each package that the pick and place handler is to be used with.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 illustrates an input arm according to the prior art;

FIG. 2 illustrates a soak buffer according to the prior art;

FIG. 3 illustrates an input/output holding fixture according to the prior art;

FIG. 4 illustrates a test arm according to the prior art;

FIG. 5 illustrates an input arm assembly according to the invention;

DETAILED DESCRIPTION OF THE INVENTION

Figure 6:
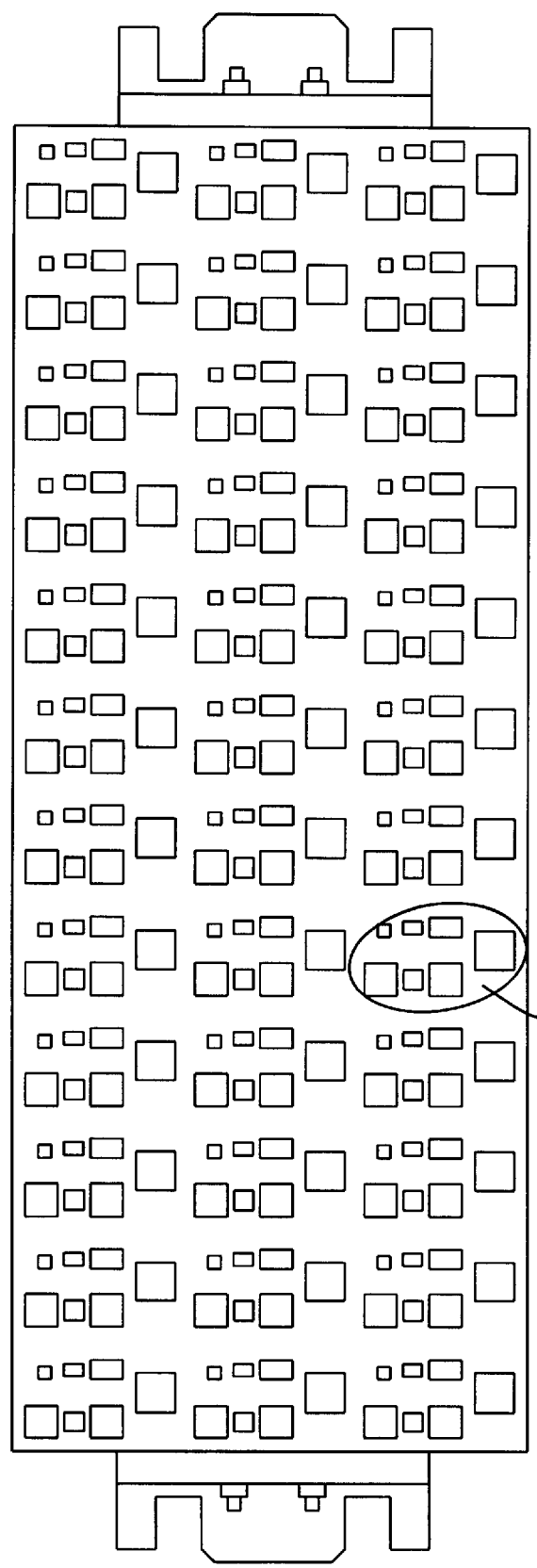
FIG. 6 illustrates a soak buffer according to the invention.

The present invention will be described in detail with reference to the accompanying drawings. The present invention provides a method and device for converting a pick and place handler for a semiconductor device with a different package and/or size.

Problem Identified by the Inventors—FIGS. 1–4

An input arm (1) known by the inventors to have a problem is shown in FIG. 1. The input arm comprises a vacuum lead (2) which is placed proximate a semiconductor device to be transported. The vacuum pressure from the vacuum lead lifts the device (picks), and transports the device to the desired location, whereupon the vacuum pressure is shut off and the device is released (place). The input arm is typically attached to a base handler by clips (3). Different packages, such as ball grip array (BGA), quad flat package (QFP), chip scale package (CSP), and plastic lead chip carrier (PLCC), and different package sizes can require different vacuum leads to adequately lift and hold the package. Conversion to a different vacuum lead requires changing the input arm. Maintaining a different input arm for each package/size is expensive, and the conversion time can increase overall manufacturing cycle time.

Another problem with converting a pick and place handler to a different package/size semiconductor device is that holding fixtures (e.g. soak buffers and I/O shuttle plates, shown in FIGS. 2 and 3 respectively) must be changed to accommodate the new package/size. Again, maintaining different fixtures for each package/size is expensive. Also, the conversion process adversely effects manufacturing cycle time.

Yet another problem with converting a pick and place handler to a different package/size semiconductor device is that a new test arm assembly, as shown in FIG. 4, is required. The test arm assembly typically comprises a contact area, which contacts the electrical leads of a device to be tested. Maintaining test arms for each package/size is expensive. The conversion process adversely effects manufacturing cycle time.

The problem with the prior art conversion kits for pick and place handlers is that they require an expensive collection of assembly arm, fixtures and test arms. Also, set-up times for converting the replacement input arm, fixtures, and test arm adversely effect manufacturing cycle time.

Preferred Embodiment of the Invention—FIGS. 5–9

Referring to FIG. 5, the preferred embodiment of the present invention begins by providing an input arm assembly (100). The input arm assembly comprises a pressure fitting (110), an input arm body (120), input arm clips (130), and a vacuum lead (140) selected from a set of interchangeable vacuum leads having different sizes. The correct size vacuum lead (140) for the semiconductor device to be picked and placed, is inserted in a through hole (150) in the input arm body (120). The vacuum lead (140) is retained by a set screw on the pressure fitting (110).

Each vacuum lead (140) has an upper hollow cylindrical portion and a lower hollow cylindrical portion with a flange therebetween. The upper cylindrical portion is inserted into the through hole (150) in the input arm body (120). The lower cylindrical portion is moved proximate to a semiconductor device, such that vacuum pressure drawn through the vacuum lead lifts and holds the semiconductor device. A compression spring (160) is placed over the upper cylindrical portion of the vacuum lead (140) to provide suspension to the input arm assembly. When the vacuum lead contacts a semiconductor device, the spring is compressed and the force on the semiconductor device is reduced.

A key advantage of the present invention is that the input arm can be converted to a different size vacuum lead by changing to a different vacuum lead from the set of interchangeable vacuum leads. This reduces set-up time compared to the prior art which requires changing the entire input arm. Inventory cost is reduced because the present invention only requires multiple vacuum leads rather than multiple input arms. Also, the present invention provides suspension, due to the spring, preventing damage to semiconductor devices when the vacuum lead contacts those semiconductor devices. Referring to FIG. 6, the soak buffer (200) of the present invention has an array of pockets groupings (210), wherein each grouping comprises the same pattern of pockets of different shapes and/or sizes to accommodate different semiconductor devices or packages. During package-to-package conversion, the base handler of a pick and place handler can be programmed to place packages into the corresponding pockets by programming an offset equal to the distance from the previous pocket in the pocket grouping to the desired pocket in the pocket grouping. Since only one soak buffer is required, the present invention eliminates the set-up time required to change soak buffers for different semiconductor packages and eliminates the cost associated with maintaining multiple soak buffers.

Figure 7:
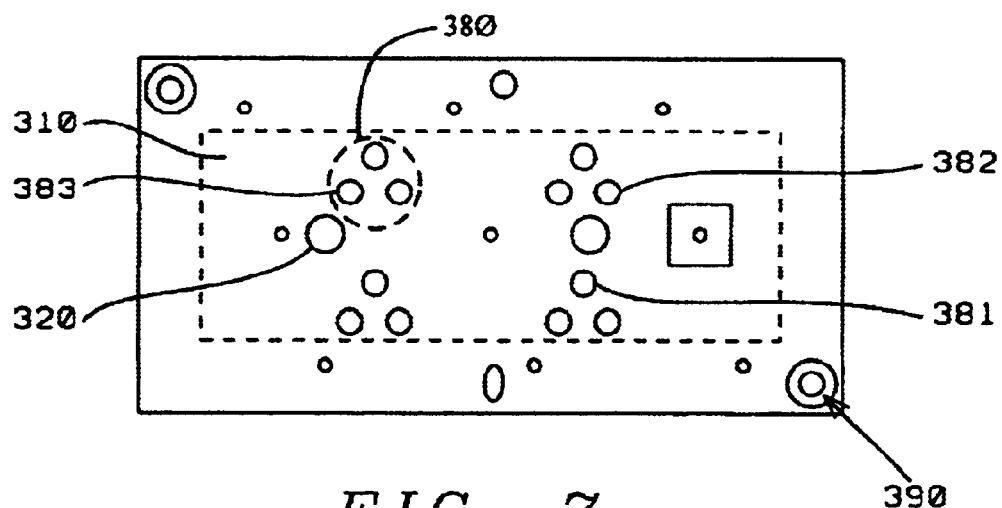
FIG. 7 illustrates an input/output shuttle plate according to the invention.

Referring to FIG. 7, the input/output (I/O) shuttle plate of the present invention comprises a base plate (310) that can be fastened onto the base handler of a pick and place handler. For example, the base plate can be fastened using a fastening means (360 in FIG. 8). The base plate comprises 2 or more alignment pins (320), most preferably 2. The base plate further comprises a series of attachment means groupings (380), such as threaded holes for attaching a block (330 in FIG. 8) to the base plate (310).

Figure 8:
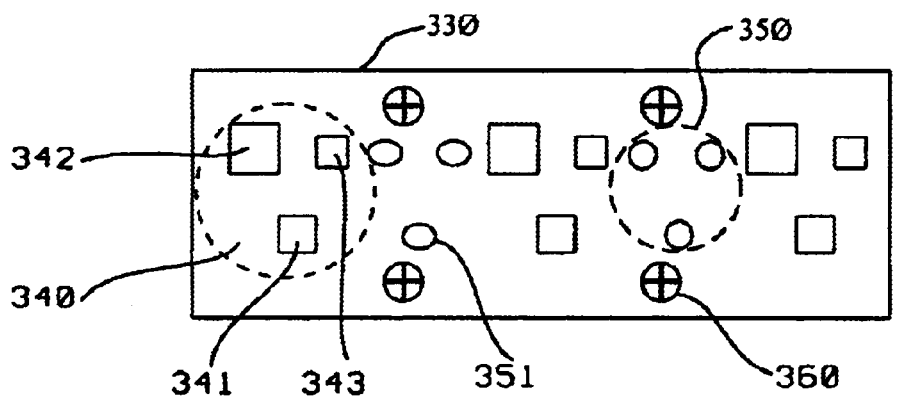
FIG. 8 illustrates a block for holding semiconductor devices prior to and after handling by an input arm of a pick and place handler, that mounts on the shuttle plate shown in FIG. 7, according to the invention.

Referring to FIG. 8, the block (330) comprises a series of pocket groupings (340). Each pocket grouping comprises pockets of different shapes and/or sizes to accommodate different semiconductor devices or packages. For example, the pocket grouping could comprise a first pocket (341), a second pocket (342) and a third pocket (343), as shown in FIG. 8. However, it should be understood that each pocket grouping could comprise a greater or lesser number of pockets. The second pocket in each grouping of pockets is offset from the first pocket by a first offset having a first distance and direction. The third pocket of each grouping of pockets is offset from the first pocket by a second offset having a second distance and direction.

The block (330) further comprises a series of alignment hole groupings (350), where the number of groupings is equal to the number of alignment pins (320 in FIG. 7) in the base plate (310 in FIG. 7), and the number of holes in each alignment hole grouping is equal to the number of pockets in each pocket grouping (340). The offsets of the alignment holes within each alignment hole grouping (350) are equal to the offsets of the pockets within each pocket grouping (340). For example, the offset of a second alignment hole (352) to a first alignment hole (351) would have a first difference and a first direction equal to the first distance and first direction of the first offset of a second pocket (342) to a first pocket (341). Similarly the offset of a third alignment hole (353) to a first alignment hole (351) would be equal to the offset of a third pocket (343) to a first pocket (341).

The block (330) is fastened to the base plate (310 in FIG. 7) by fastening means (360) in the block (330), such as unthreaded holes, through which screws pass and are threaded into one of the threaded holes in each alignment means grouping (380 in FIG. 7) in the base plate. The threaded holes (381, 382, 383) in the alignment means groupings (380) in FIG. 7 are offset by distances equal to the offsets of the pockets (341, 342, 343 in FIG. 8) but in the opposite directions, such that when the first alignment holes (351 in FIG. 8) are inserted over the alignment pins (320), the fastening means (360) in the block are lined up to the first threaded holes (381) in the base plate.

During a package-to-package conversion, the position of the block (330) relative to the base plate (310) is changed to bring the desired pockets (e.g. first pockets, second, pockets, etc) to the programmed location for picking and/or placing the semiconductor devices. The position of the block is changed by removing the fastening means, inserting the alignments holes from the alignment hole groupings corresponding to the desired pockets onto the alignment pins, and attaching the fastening means to the corresponding alignment means (threaded holes) from the alignment means groupings. The present invention reduces set-up time because package-to-package conversion can be achieved by repositioning the block instead of retrieving and installing a replacement shuttle plate. Also, costs are reduced since one shuttle plate according to the present invention can be used for multiple packages, instead of a different shuttle plate for each package.

Figure 9:
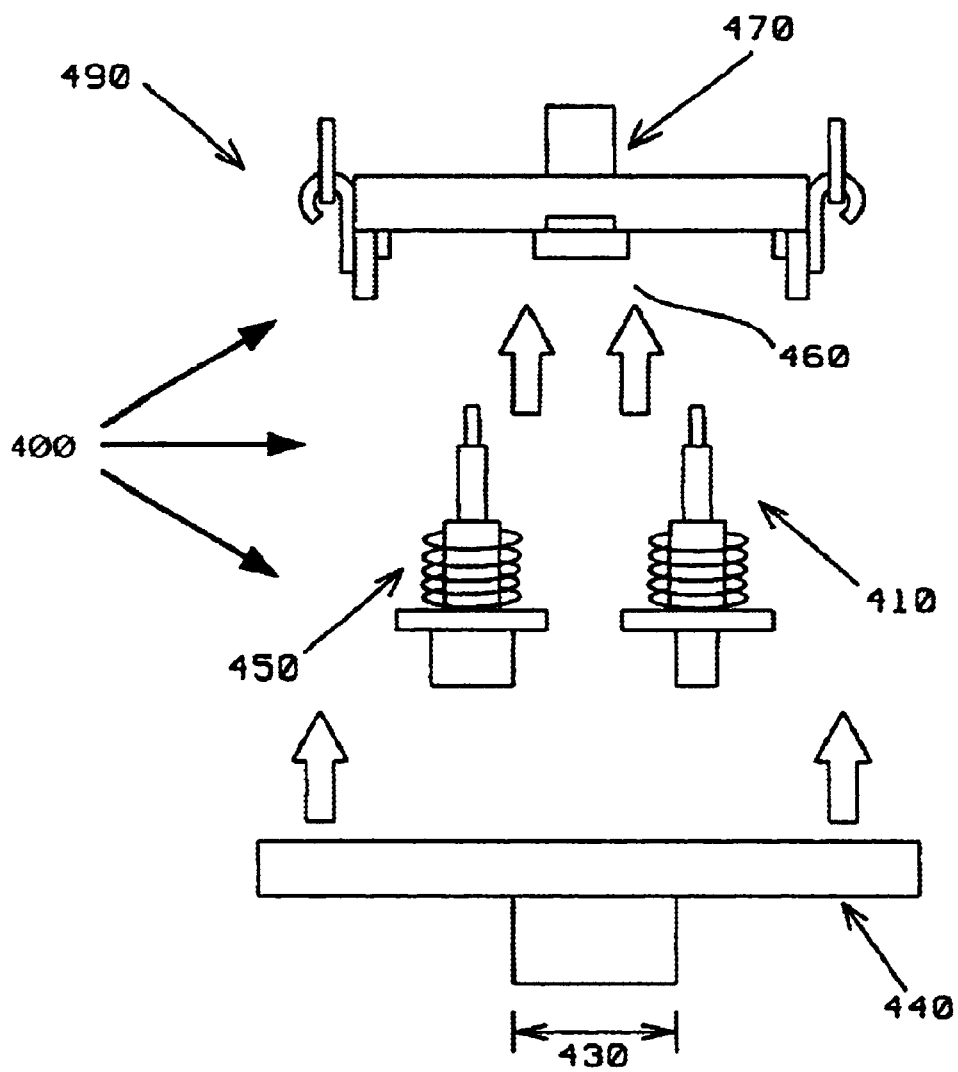
FIG. 9 illustrates a test arm assembly according to the invention.

Referring to FIG. 9, the test arm assembly (400) of the present invention has a set of interchangeable vacuum leads and a set of interchangeable nest pieces. A vacuum lead (410) selected from the set of interchangeable vacuum leads is inserted into a through hole (460) in a test arm body (480), and retained by a test arm cap (470). The test arm cap retains the vacuum lead by a set screw on the test arm cap. The test arm body is attached to pick and place handler by test arm clips (490). A test arm nest piece (440) selected from the set of test arm nest pieces is attached to the vacuum lead by vacuum pressure. The test arm nest piece (440) has a contact area (430) which is brought into contact with a semiconductor device in order to perform testing on that semiconductor device. In one embodiment of the present invention, springs (450) are provided around the vacuum lead (410) which provide suspension to prevent damage to a semiconductor device when the contact area is brought into contact with the semiconductor device. The test arm of the present invention can be converted to a different package by changing to a different vacuum lead and a different nest piece. This reduces set-up time compared to the prior art which requires removing one test arm, and retrieving and installing a different test arm. Inventory cost is reduced because the present invention only requires multiple vacuum leads and nest pieces rather than multiple test arms. Also, the present invention provides suspension, due to the spring, preventing damage to semiconductor devices when the nest piece contacts those semiconductor devices.

While the invention has been particularly shown and described with reference to the preferred embodiments thereof, it will be understood by those skilled in the art that various changes in form and details may be made without departing from the spirit and scope of the invention. For example, in the I/O shuttle plate, the alignment means groupings could be located on the block and fastening means could be located in the base plate. Also, in the I/O shuttle plate, alignment holes could be in the base plate, and alignment pins could be located in the block.

What is claimed is:

1. A method for package-to-package conversion of a pick and place handler, comprising the steps of:

(a) removing a vacuum lead from an input arm assembly having a set of interchangeable vacuum leads;

(b) inserting a different size vacuum lead from said set of interchangeable vacuum leads into said input arm assembly, said vacuum lead size being selected to handle a semiconductor device;

(c) removing a block of an input/output shuttle plate from a base plate of said input/output shuttle plate by removing attachment means and lifting said block off of alignment pins on said base plate; said block comprising a plurality of pocket groupings therein, whereby each pocket grouping consists of a pattern of pockets of different sizes and/or shapes having specific offsets from each other; said block further comprising a plurality of alignment hole groupings, whereby, when a particular alignment hole in each of said alignment hole groupings is fitted onto said alignment pins, the corresponding pocket in each pocket grouping is correctly located for the pick and place handler; said base plate comprising a plurality of attachment means groupings, whereby when a particular alignment hole in each of said alignment hole groupings is fitted onto said alignment pins, the corresponding attachment means in each attachment means grouping on said base plate is aligned with an attachment means in said block;

(d) repositioning said block on said base plate such that a selected pocket in each pocket grouping is correctly located for the pick and place handler by fitting the alignment hole in each alignment means grouping corresponding to said selected pocket onto an alignment pin and fastening said block to said base plate by fastening each of said attachment means in said block to an attachment means in each of said attachment means groupings corresponding to said selected pocket; whereby said selected pocket in each pocket grouping is aligned with said input arm assembly when each pocket grouping is presented to said input arm assembly, said semiconductor device being aligned with said input arm assembly when said semiconductor device is handled in said selected pocket;

(e) programming an offset into the pick and place handler controlling the movement of a soak buffer, said soak buffer having an array of soak pocket groupings, wherein said soak pocket grouping consists of a pattern of soak pockets of different sizes and/or shapes having specific offsets from each other, whereby a selected soak pocket in each soak pocket grouping is aligned with said input arm assembly when each soak pocket grouping is presented to said input arm assembly, said selected soak pocket size and/or shape corresponding to the size and/or shape of said selected pocket in said block, said semiconductor device being aligned with said input arm assembly when said semiconductor device is handled in said selected soak pocket;

(f) removing a nest piece and a vacuum lead from a test arm assembly having a set of interchangeable nest pieces and a set of interchangeable vacuum leads;

(g) inserting a different size vacuum lead from said set of interchangeable vacuum leads into said test arm assembly, said vacuum lead size being selected to handle said semiconductor device; and (h) attaching a different nest piece from said set of interchangeable nest pieces onto said different vacuum lead with vacuum pressure, said nest piece being selected to test said semiconductor device.

* * * * *